(12) United States Patent
Yeh

(10) Patent No.: US 9,726,720 B2
(45) Date of Patent: Aug. 8, 2017

(54) INTEGRATED CIRCUIT TEST DEVICE AND INTEGRATED CIRCUIT TEST EQUIPMENT

(71) Applicant: Cheng Yun Technology Co., Ltd., New Taipei (TW)

(72) Inventor: Yun-Meng Yeh, New Taipei (TW)

(73) Assignee: CHENG YUN TECHNOLOGY CO., LTD., New Taipei (TW)

( * ) Notice: Subject to any disclaimer, the term of this patent is extended or adjusted under 35 U.S.C. 154(b) by 148 days.

(21) Appl. No.: 14/929,582

(22) Filed: Nov. 2, 2015

(65) Prior Publication Data

US 2017/0123002 A1 May 4, 2017

(51) Int. Cl.
*G01R 31/28* (2006.01)
*G01R 1/073* (2006.01)

(52) U.S. Cl.
CPC ......... *G01R 31/2893* (2013.01); *G01R 1/073* (2013.01); *G01R 31/2886* (2013.01)

(58) Field of Classification Search
CPC .......... G06F 21/79; G01R 1/073; B24B 49/12
See application file for complete search history.

(56) References Cited

U.S. PATENT DOCUMENTS

| 2002/0171133 A1* | 11/2002 | Mok | G01R 1/06711 257/678 |
| 2006/0066293 A1* | 3/2006 | Gopal | G01R 31/2867 324/750.14 |
| 2011/0007146 A1* | 1/2011 | Kaida | H05K 13/0413 348/87 |

* cited by examiner

*Primary Examiner* — Jermele M Hollington
*Assistant Examiner* — Alvaro Fortich
(74) *Attorney, Agent, or Firm* — Chun-Ming Shih; HDLS IPR Services

(57) ABSTRACT

An integrated circuit test device includes a carrying base with a probe station installed thereon, a clamping and positioning mechanism and a cover plate. The clamping and positioning mechanism includes a lower base, an elastic piece, an upper base and a pair of elastic arms. The lower base is arranged corresponding to the probe station. The elastic piece is elastically clamped between the probe station and the lower base. The upper base is stacked on the lower case and disposed with a chip socket. The pair of elastic arms is movably arranged in the chip socket. The cover plate is fixed to the carrying base. The cover plate is disposed with an opening corresponding to the chip socket. A sliding structure (A) is disposed between the pair of elastic arms and the cover plate for enabling the pair of elastic arms to clamp and fix the integrated circuit.

14 Claims, 9 Drawing Sheets

INTEGRATED CIRCUIT TEST DEVICE AND INTEGRATED CIRCUIT TEST EQUIPMENT

TECHNICAL FIELD

The disclosure relates to a test device, more particularly to a test device and a test equipment for integrated circuits.

BACKGROUND

As technology advances, a large amount of information and electronic devices are designed to be compact, but also with increased number of functions. Thus, the usages of integrated circuits (ICs) which can perform multiple functions are inevitable. The integrated circuit has complicated structures and narrow line width so the manufacturing processes thereof are somewhat difficult and the manufacturing costs are high. This makes the quality control thereof even more crucial. Before being shipped, each integrated circuit has to go through quality testing by the test equipment. The test equipment mainly comprises a test base and a test board. After the integrated circuit is put on the test base, it is electrically connected to the test board via the test base for testing.

The conventional integrated circuit test device main comprises a base and a cover pivoted on the base. The base is disposed with a concave with a conduction structure disposed therein. The bottom surface of the cover is disposed with an abutting element. The conduction structure is disposed with a position portion corresponding to the fixing of the integrated circuit to be tested, and the positioning portion is disposed with a plurality of through holes corresponding to the positions of the solder balls on the bottom of the integrated circuit to be tested. The through holes are configured for sleeving on and fixing the solder balls of the integrated circuit to be tested, for positioning the integrated circuit on the positioning portion. The bottom of the positioning portion is disposed with a conduction portion conducting the integrated circuit to be tested and the test board. For performing testing processes, the integrated circuit to be tested is in conduction with the conduction portion via the pressing of the abutting element and is in conduction with the test board via the conduction component of the conduction portion.

Although the conventional integrated circuit test device can perform testing, it still has problems. Specifically, when the abutting element presses the integrated circuit, this may break the probe of the conduction portion. Moreover, to facilitate the placement of the integrated circuit, the positioning portion and the integrated circuit are loosely arranged in relation to each other. This results in inaccurate alignment of the integrated circuit and the probe, which also needs to be amended.

SUMMARY

One purpose of the disclosure is to provide an integrated circuit test device and an integrated circuit test equipment which are capable of fast positioning and precise holding.

To fulfill the purpose, the disclosure provides an integrated circuit test device comprising a carrying base with a probe station installed thereon, a clamping and positioning mechanism and a cover plate. The clamping and positioning mechanism comprises a lower base, an elastic piece, an upper base and a pair of elastic arms. The lower base is arranged in a manner corresponding to the probe station. The elastic piece is elastically clamped between the probe station and the lower base. The upper base is stacked up on the lower case and disposed with a chip socket. The pair of elastic arms is movably arranged in the chip socket. The cover plate is fixed to the carrying base. The cover plate is disposed with an opening corresponding to the position of the chip socket. A sliding structure is disposed between the pair of elastic arms and the cover plate for enabling the pair of elastic arms to clamp and fix the integrated circuit.

To fulfill the purpose, the disclosure provides an integrated circuit test equipment comprising a carrying base, a plurality of clamping and positioning mechanisms and a cover plate. The carrying base is with a plurality of probe stations installed thereon. The plurality of clamping and positioning mechanisms is installed in a manner corresponding to each probe station and each comprises a lower base, an elastic piece, an upper base and a pair of elastic arms. The lower base is arranged in a manner corresponding to the probe station. The elastic piece is elastically clamped between the probe station and the lower base. The upper base is stacked up on the lower case. The upper base is disposed with a chip socket and the pair of elastic arms is movably arranged in the chip socket. The cover plate is fixed to the carrying base. The cover plate is disposed with an opening corresponding to the position of the chip socket. A sliding structure is disposed between the pair of elastic arms and the cover plate for enabling each of elastic arms to clamp and fix the integrated circuit.

The disclosure can also provide following effects. Firstly, the sliding structure is disposed between the cover plate and the elastic arm so pressing the upper base drives each elastic arm to clamp and fix the integrated circuit, which makes it more convenient to use. Secondly, the arrangement of the V-shaped groove of the T-shaped movable block results in precise positioning regarding the diagonal corners of the integrated circuit.

BRIEF DESCRIPTION OF THE DRAWINGS

The disclosure will become more fully understood from the detailed description and the drawings given herein below for illustration only, and thus does not limit the disclosure, wherein.

DETAILED DESCRIPTION

Figure 1:
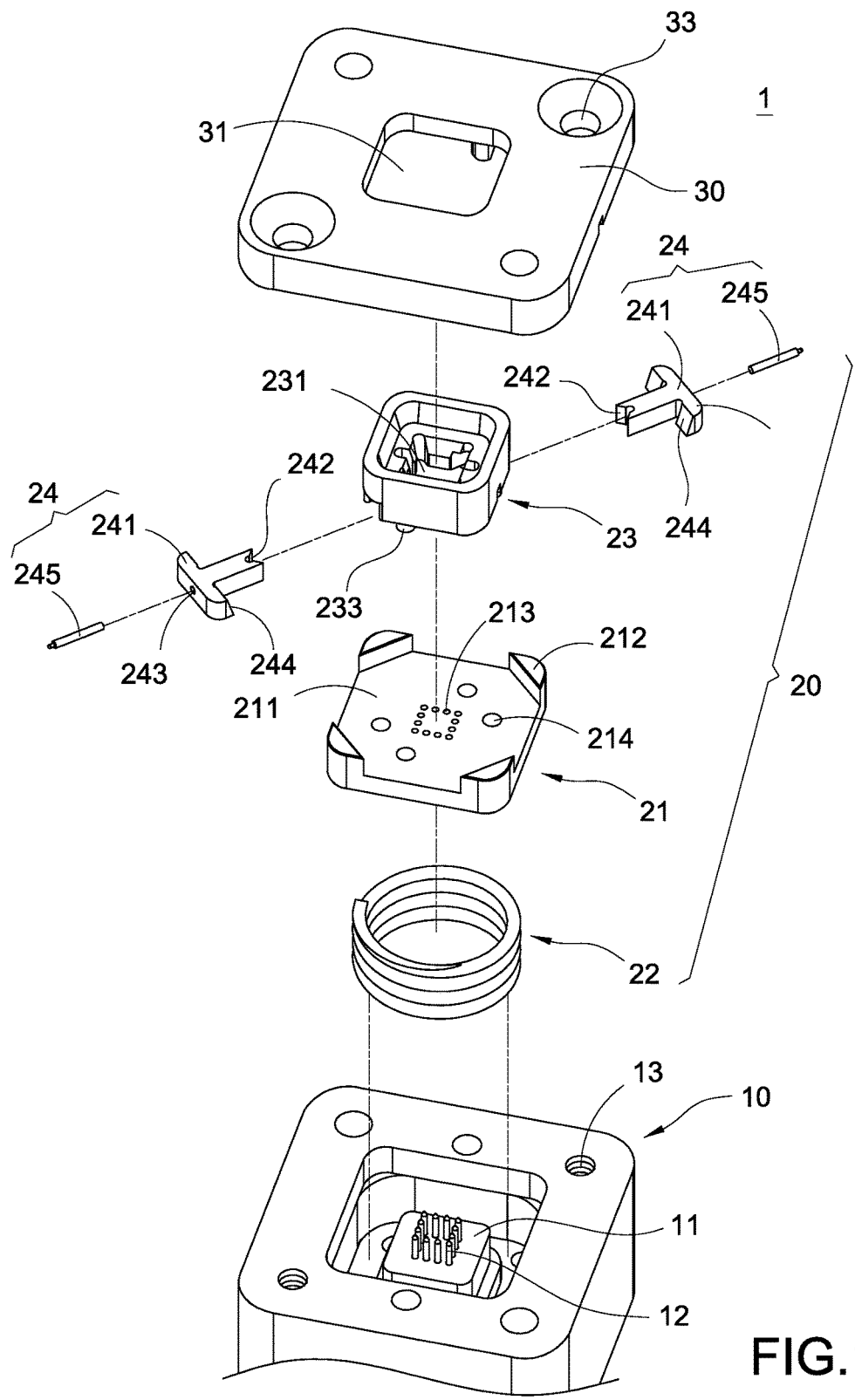
FIG. 1 is an exploded view of an integrated circuit test device of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
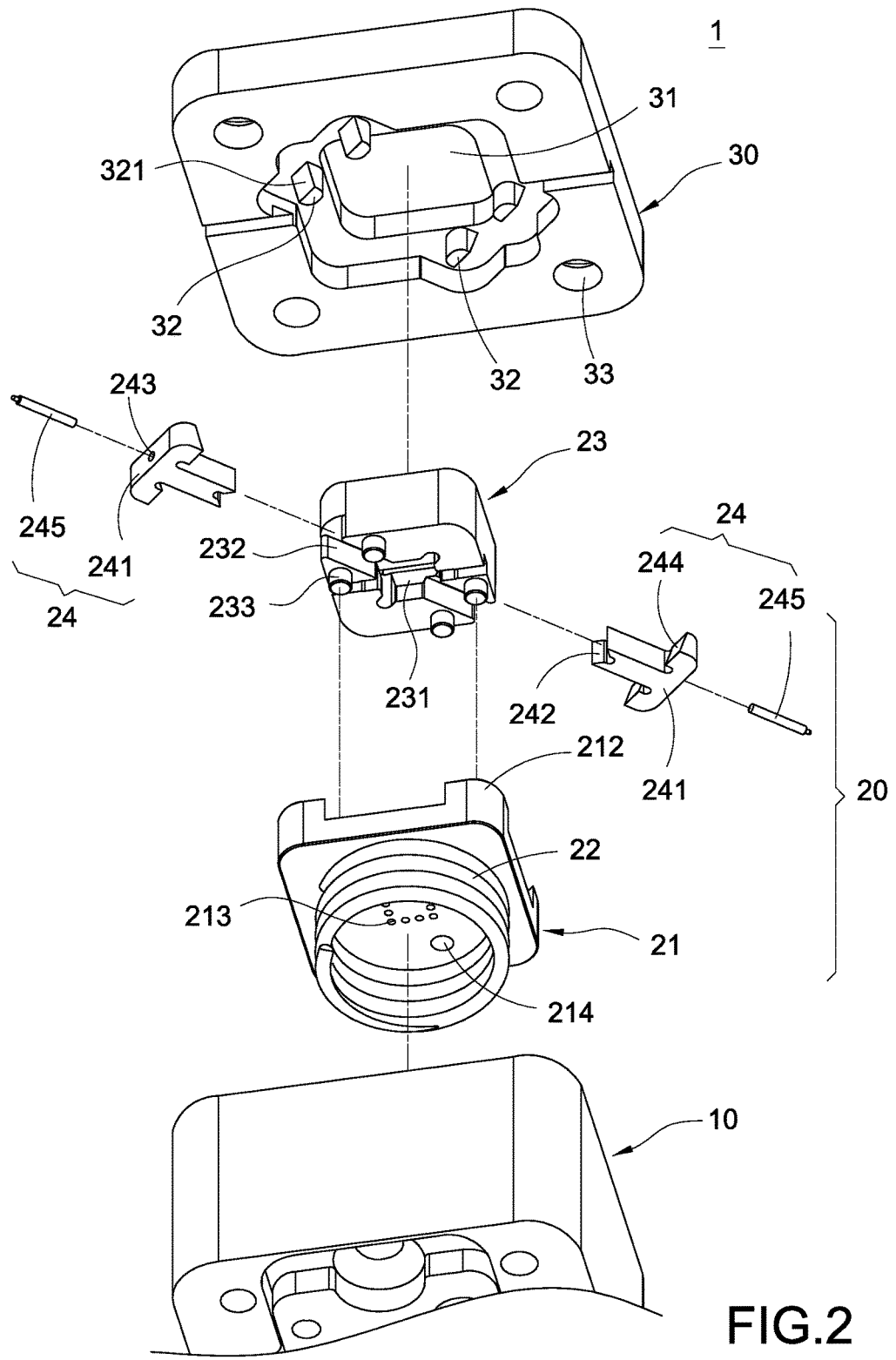
FIG. 2 is an exploded view of the integrated circuit test device of the disclosure from another angle.
Figure 3:
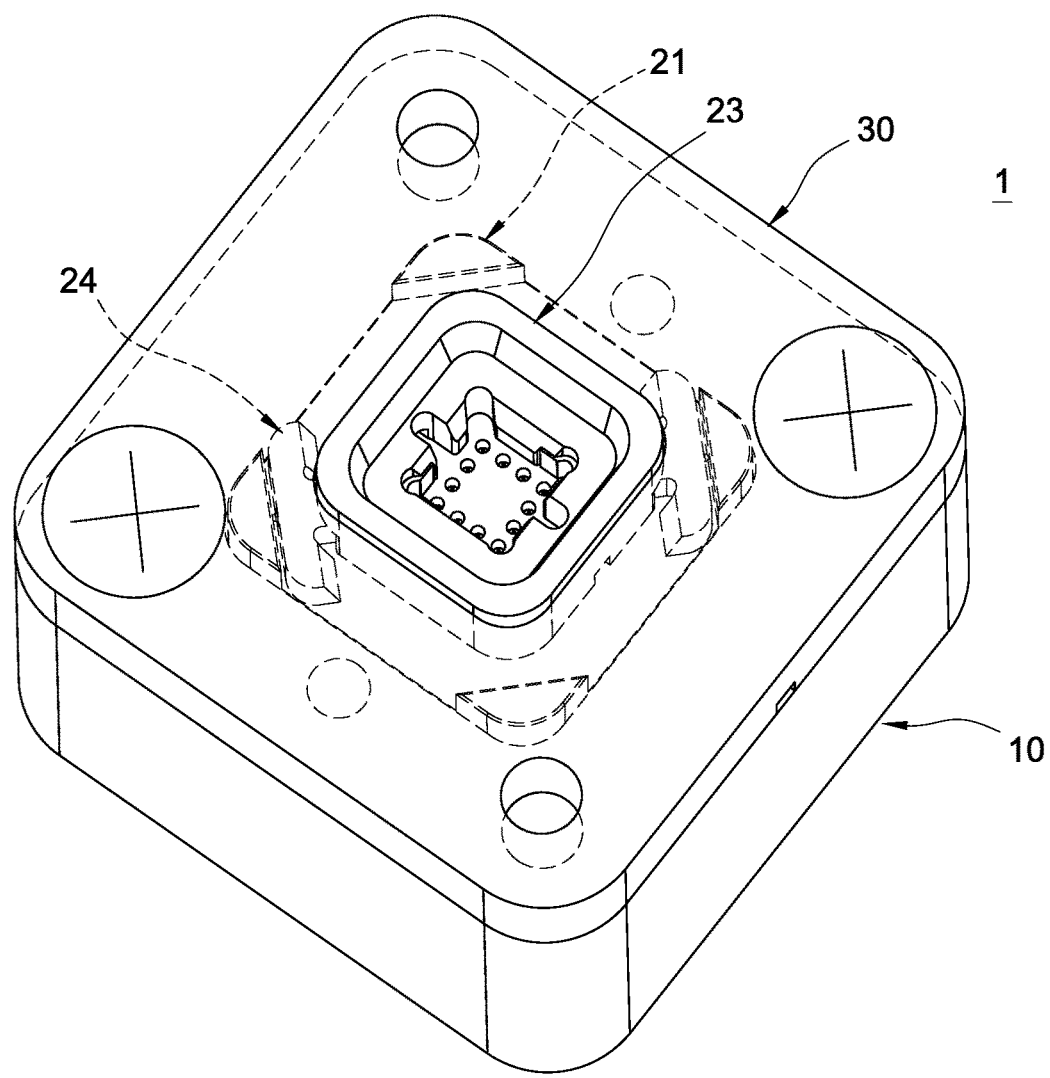
FIG. 3 is a perspective view of the integrated circuit test device of the disclosure.

As seen in FIG. 1 to FIG. 3, the disclosure provides an integrated circuit test device 1 mainly comprising a carrying base 10, a clamping and positioning mechanism 20 and a cover plate 30.

The carrying base 10 is roughly a hollow rectangular body and the inside thereof is disposed with a probe station 11. A plurality of elastic probes 12 are arranged on the probe station 11 while a screwing hole 13 is disposed on the corner of the top surface of the carrying base 10 respectively.

The clamping and positioning mechanism 20 is installed in a manner corresponding to the probe station 11 of the carrying base 10 and mainly comprises a lower base 21, an elastic piece 22, an upper base 23 and a pair of elastic arms 24. The lower base 21 comprises a rectangular plate 211 and a corner stick 212 respectively extends from four corners of the rectangular plate 211. The elastic piece 22 may be a coil spring which is sleeved on the outer periphery of the probe station 11. Two ends of the elastic piece 22 are disposed between and in elastic contact with the probe station 11 and the rectangular plate 211. A plurality of through holes 213 corresponding to the elastic probes 12 is formed on the central region of the rectangular plate 211, and a plurality of guide holes 214 is disposed on the peripheral region of each through hole 213.

The upper base 23 is stacked up on the rectangular plate 211 of the lower base 21. The upper base 23 is roughly a rectangular block with a chip socket 231 formed in the central region thereof. One of the diagonal positions of the bottom surface of the upper base 23 forms a guide groove 232 connecting the chip socket 231. Two sides of the guide groove 232 are connected to a plurality of positioning sticks 233 respectively. Each positioning stick 233 goes through the corresponding guide hole 214.

Each elastic arm 24 mainly comprises a T-shaped movable block 241 and an elastic needle 245. Each T-shaped block 241 is installed in the guide groove 232 and may be operated to move in the guide groove 232. A V-shaped groove 242 is formed on the bottom end of the T-shaped movable block 241 while a plugging hole 243 is disposed on the top end. One end of the elastic needle 245 is plugged into the plugging hole 243 while the elastic needle 242 is elastically clamped between the T-shaped movable block 241 and the corner stick 212.

Figure 6:
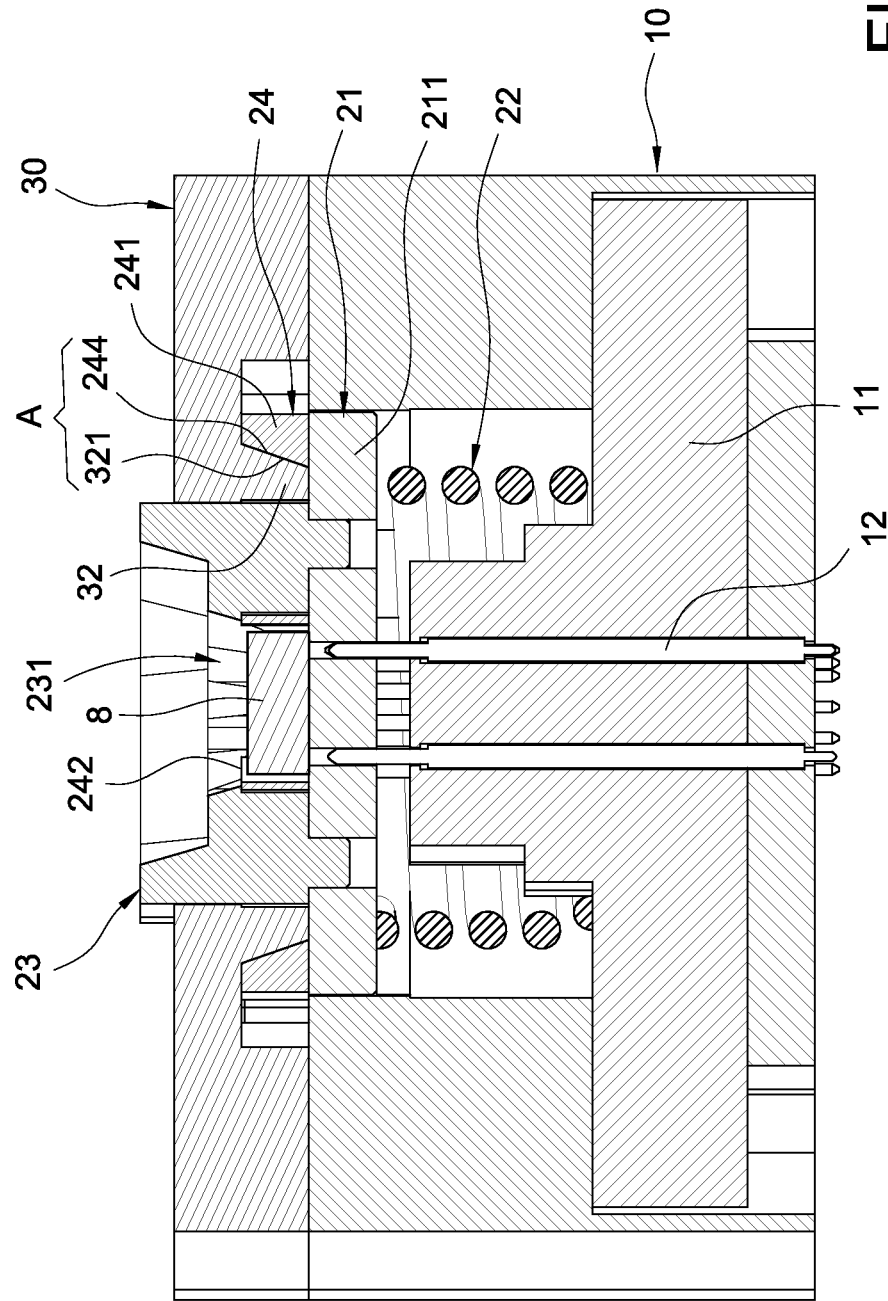
FIG. 6 is a sectional view of FIG. 4 along the line 6-6.

The cover plate 30 is a rectangular plate and is connected to the carrying base 10 correspondingly. The central region of the cover plate 30 forms a rectangular opening 31 which exposes the upper base 23. Two lateral sides of the T-shaped block 241 respectively form a first inclined plane 244 while the corresponding corners of the opening 31 of the cover plate 30 extend and form a pair of protruding sticks 32 corresponding to the two lateral sides of the T-shaped movable block 241. A second inclined plane 321 is disposed on the position of the protruding stick 32 corresponding to the first inclined plane 244, in which the inclined directions of the second inclined plane 321 and the first inclined plane 244 are opposite. Besides, the second inclined plane 321 and the first inclined plane 244 are in sliding contact and therefore form a sliding structure A of the disclosure (as shown in FIG. 6). Furthermore, the position of each corner of the cover plate 30 respectively forms a connecting hole 33. The arrangement of each connecting hole 33 corresponds to the screwing hole 13 of the carrying base 10, for screwing components, such as screws, to go through and be fastened.

Figure 4:
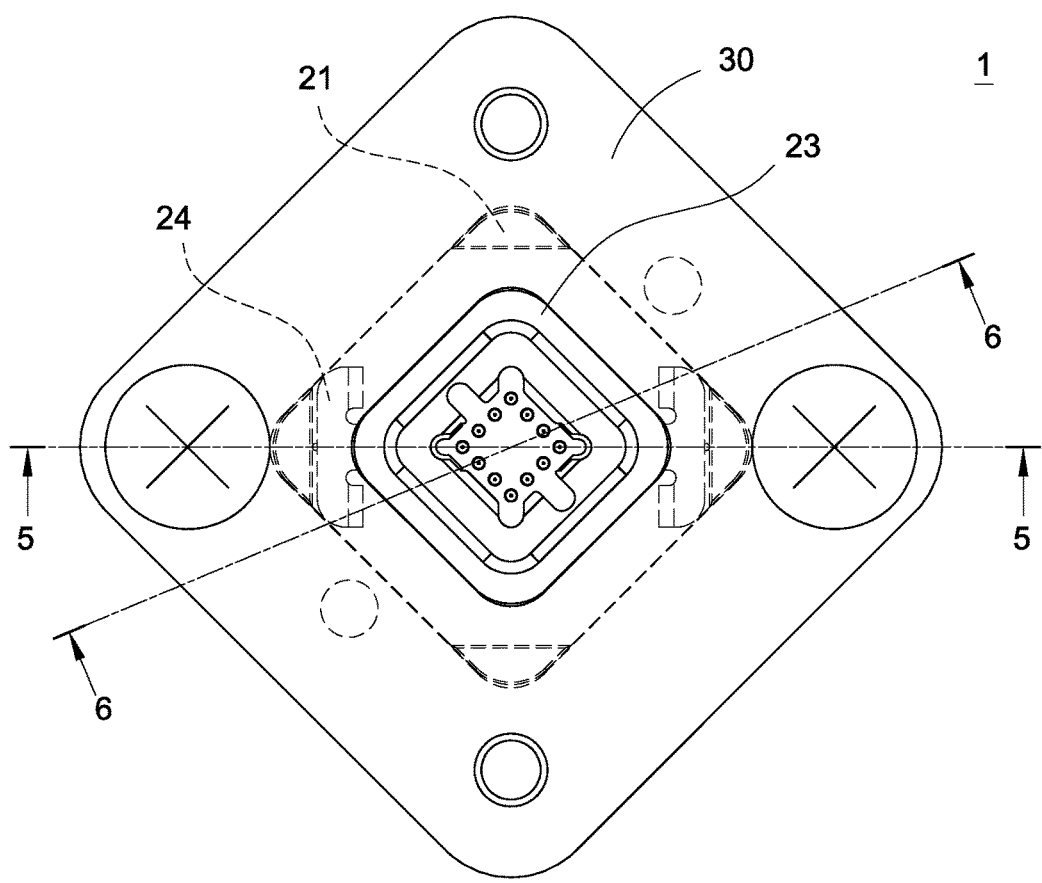
FIG. 4 is a top view of the test device applied for the integrated circuit according to the disclosure.
Figure 5:
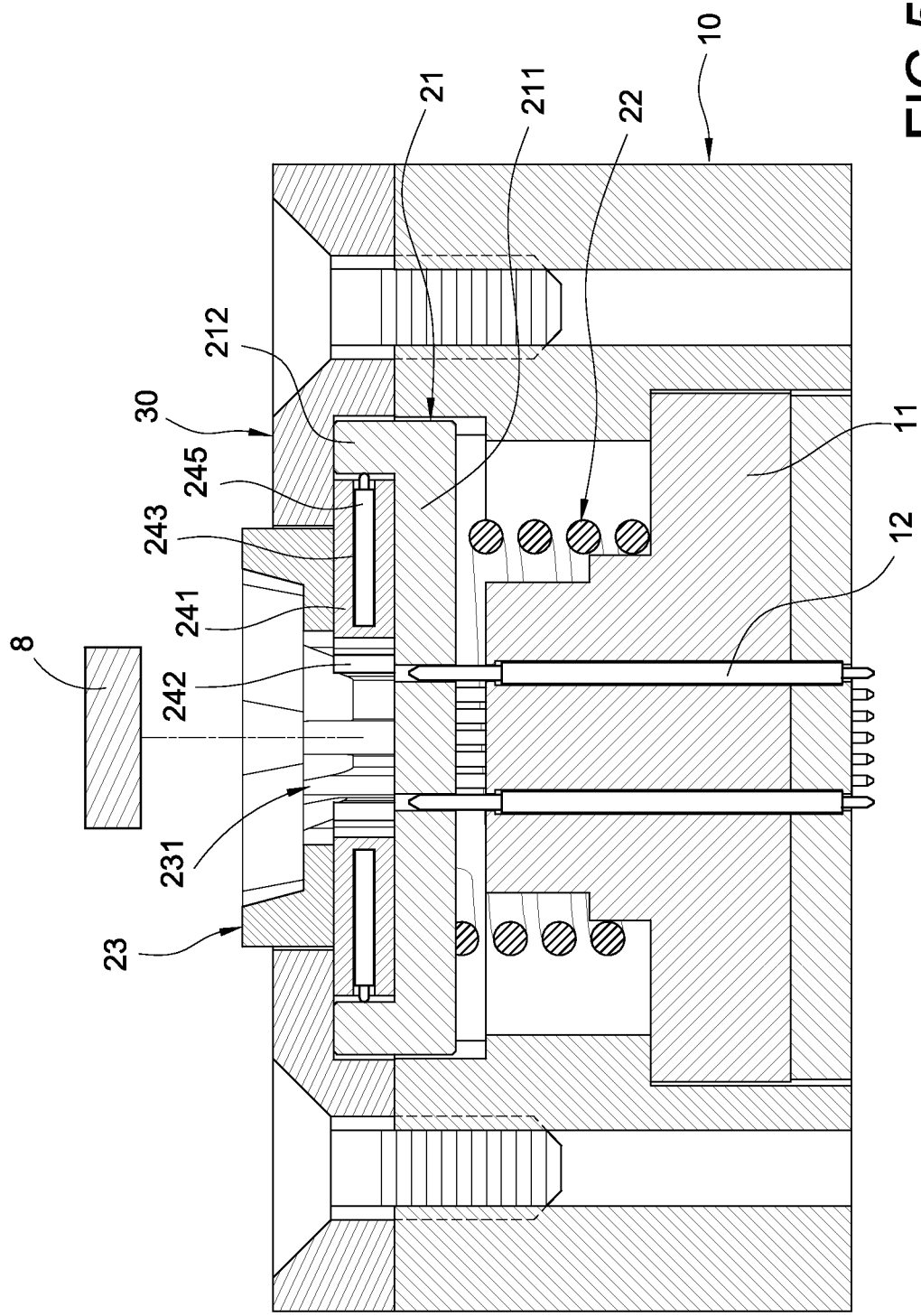
FIG. 5 is a sectional view of FIG. 4 along the line 5-5.

As seen in FIG. 4 and FIG. 6, the test device 1 of the disclosure can be applied for the test of an integrated circuit 8. Firstly, each elastic probe 12 is electrically connected to a test machine (not shown in the figures), and then the integrated circuit 8 is put in the chip socket 231 of the upper base 23. Since the shape of the integrated circuit 8 is similar to the chip socket 231, the corners of the integrated circuit 8 correspondingly sits on the corners of the chip socket 231. At this point, the integrated circuit 8 is not in electrical connection with each elastic probe 12.

Figure 7:
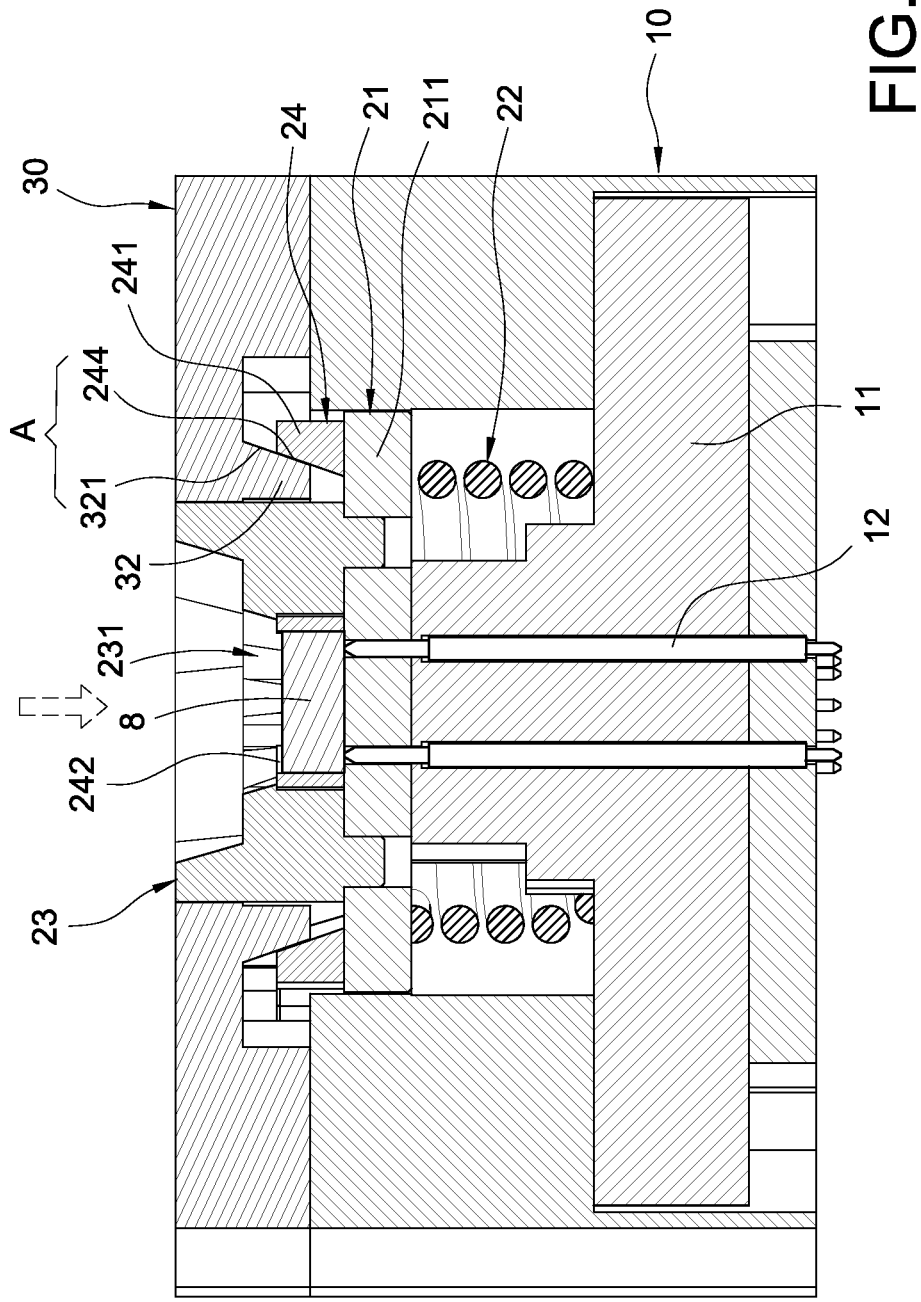
FIG. 7 is a sectional view of the clamping and positioning mechanism being pressed down according to the disclosure.
Figure 8:
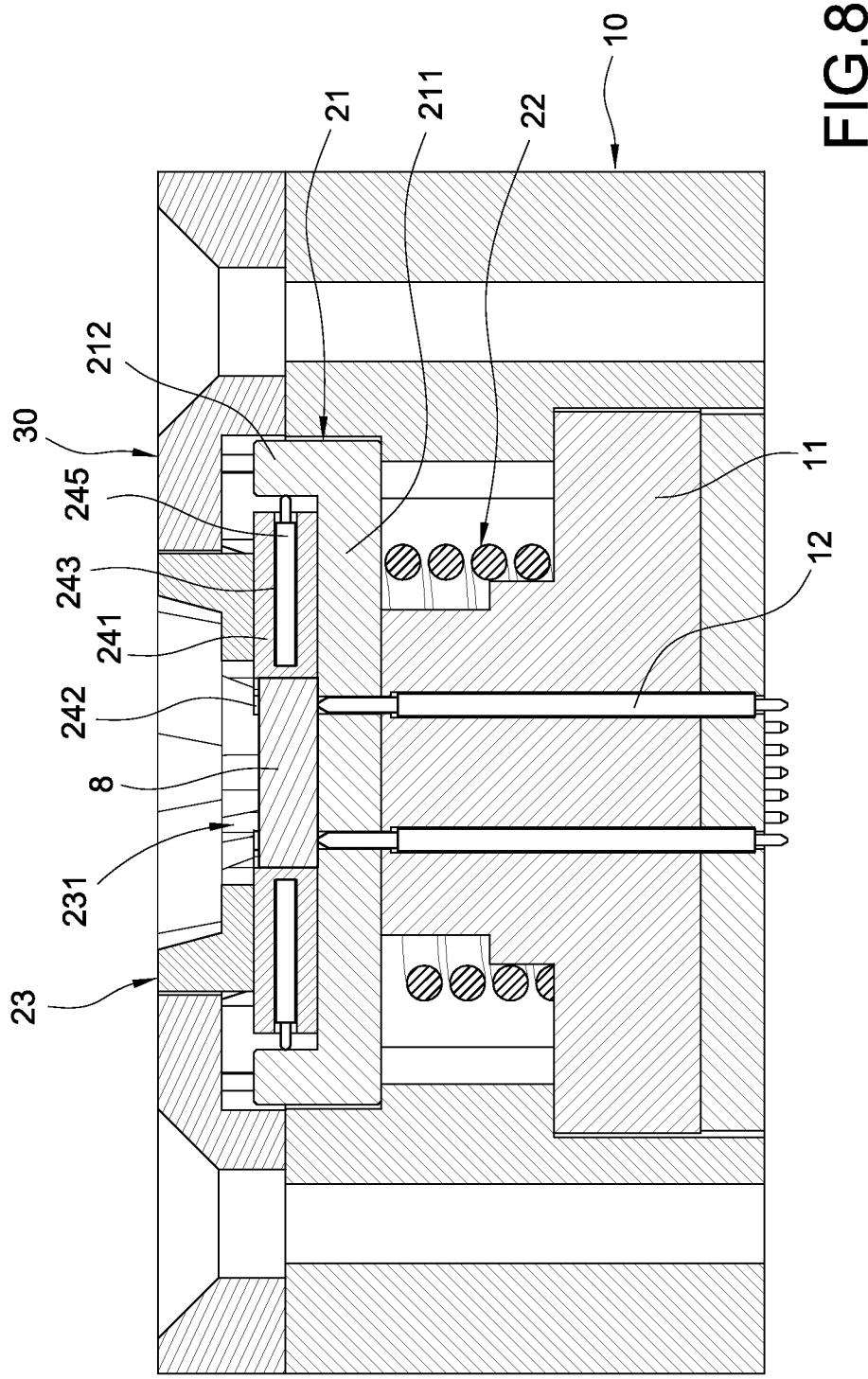
FIG. 8 is a sectional view of the clamping and positioning mechanism being pressed down from another direction, according to the disclosure.

Further referring to FIG. 7 and FIG. 8, when the upper base 23 is pressed down, each T-shaped movable block 241 is pushed by the elastic needle 245. At this point, the first inclined plane 244 slides along the second inclined plane 321, making the V-shaped groove 242 of each T-shaped movable block 241 perform clamping and positioning on a set of diagonal corners of the integrated circuit 8. Subsequently, during the process of the upper base 23 sinking down, the integrated circuit 8 and each elastic probe 12 are made to be electrically connected for accessing each performance parameter of the integrated circuit 8.

Figure 9:
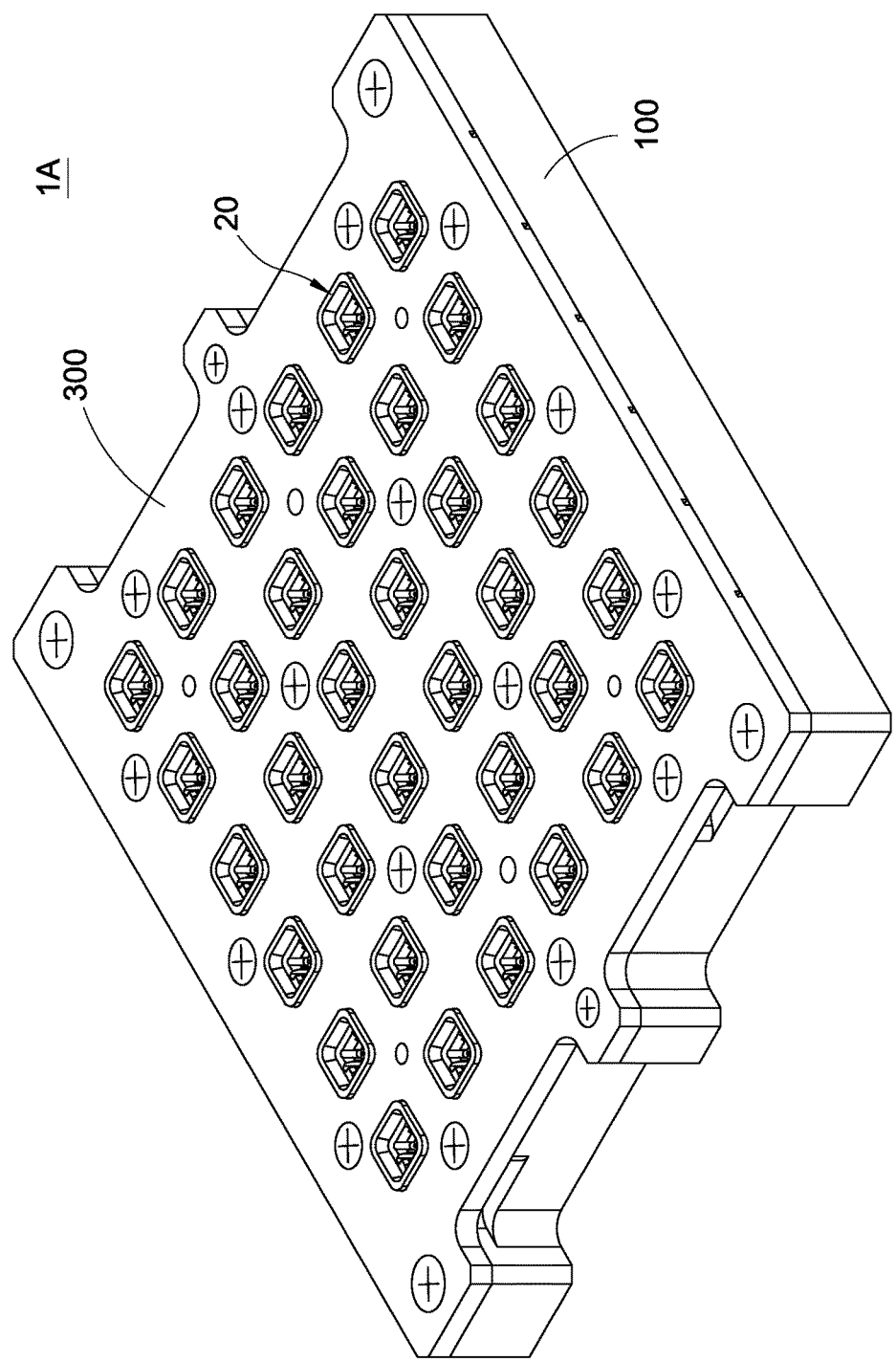
FIG. 9 is a perspective view of a test equipment of the disclosure.

Referring to FIG. 9 the disclosure further provides an integrated circuit test equipment. The integrated circuit test equipment 1A mainly comprises a carrying base 100, a plurality of clamping and positioning mechanism 20 and a cover plate 300. A plurality of probe stations 11 is installed on the carrying base 100 while a plurality of elastic probes 12 is arranged on each probe station 11 (shown in FIG. 1). Each clamping and positioning mechanism 20 is arranged in a manner corresponding to each probe station 11. Since each clamping and positioning mechanism 20 is identical to the clamping and positioning mechanism 20, it will not be illustrated here again. The cover plate 300 is fixed to the top of the carrying base 100. The position of the cover plate 300 corresponding to each chip socket 231 is disposed with an opening 31 (shown in FIG. 1). Besides, a sliding structure (shown in FIG. 8) is disposed between each elastic arm 24 and the cover plate 300, for enabling each elastic arm 24 to clamp and fix each integrated circuit 8. Consequently, multiple integrated circuits 8 may be tested at the same time and this therefore improves the quality of testing.

What is claimed is:

1. An integrated circuit test device (1), comprising:
    a carrying base (10) with a probe station (11) installed thereon;
    a clamping and positioning mechanism (20) comprising a lower base (21), an elastic piece (22), an upper base (23) and a pair of elastic arms (24), wherein the lower base (21) is arranged in a manner corresponding to the probe station (11), the elastic piece (22) is elastically clamped between the probe station (11) and the lower base (21), the upper base (23) is stacked up on the lower case (21), the upper base (23) is disposed with a chip socket (231) and the pair of elastic arms (24) is movably arranged in the chip socket (231); and
    a cover plate (30) fixed to the carrying base (10), wherein the cover plate (30) is disposed with an opening (31) corresponding to the position of the chip socket (231), and a sliding structure (A) is disposed between the pair of elastic arms (24) and the cover plate (30) for enabling the pair of elastic arms (24) to clamp and fix the integrated circuit (8).

2. The integrated circuit test device (1) according to claim 1, wherein the probe station (11) is disposed with a plurality of elastic probes (12), the lower base (21) comprises a rectangular plate (211), a plurality of through holes (213) for each elastic probe (12) to go through is formed on the rectangular plate (211).

3. The integrated circuit test device (1) according to claim 2, wherein the lower base (21) further comprises a corner stick (212) extending from each corner of the rectangular plate (211), the elastic arm (24) comprises a T-shaped movable block (241) and an elastic needle (245), the elastic needle (245) is elastically clamped between the T-shaped movable block (241) and the corner stick (212).

4. The integrated circuit test device (1) according to claim 3, wherein the bottom of the T-shaped movable block (241) forms a V-shaped groove (242) while the top of the T-shaped movable block (241) forms a plugging hole (243) for the elastic needle (245) to be plugged in.

5. The integrated circuit test device (1) according to claim 3, wherein a pair of protruding sticks (32) extends from the corresponding corner of the opening (31) of the cover plate (30), the pair of protruding sticks (32) is disposed in a manner corresponding to the two lateral sides of T-shaped movable block (241), the movable structure (A) comprises a first inclined plane (244) formed on the T-shaped movable block (241) and a second inclined plane (321) formed on the protruding stick (32), the inclined directions of the second inclined plane (321) and the first inclined plane (244) are opposite and are in sliding contact.

6. The integrated circuit test device (1) according to claim 2, wherein a guide groove (232) connecting the chip socket (231) is formed on the upper base (23), and the T-shaped movable block (241) is installed in the guide groove (232) and is capable of being operated to move.

7. The integrated circuit test device (1) according to claim 2, wherein the rectangular plate (211) of the lower base (21) is disposed with a plurality of guide holes (214), and the upper base (23) is connected to a plurality of positioning sticks (233) going through each guide hole (214).

8. An integrated circuit test equipment (1A), comprising:
a carrying base (10) with a plurality of probe stations (11) installed thereon;
a plurality of clamping and positioning mechanisms (20) installed in a manner corresponding to each probe station (11), each comprising a lower base (21), an elastic piece (22), an upper base (23) and a pair of elastic arms (24), wherein the lower base (21) is arranged in a manner corresponding to the probe station (11), the elastic piece (22) is elastically clamped between the probe station (11) and the lower base (21), the upper base (23) is stacked up on the lower case (21), the upper base (23) is disposed with a chip socket (231) and the pair of elastic arms (24) is movably arranged in the chip socket (231); and
a cover plate (30) fixed to the carrying base (10), wherein the cover plate (30) is disposed with an opening (31) corresponding to the position of the chip socket (231), and a sliding structure (A) is disposed between the pair of elastic arms (24) and the cover plate (30) for enabling each of elastic arms (24) to clamp and fix the integrated circuit (8).

9. The integrated circuit test equipment (1A) according to claim 8, wherein the probe station (11) is disposed with a plurality of elastic probes (12), the lower base (21) comprises a rectangular plate (211), a plurality of through holes (213) for each elastic probe (12) to go through is formed on the rectangular plate (211).

10. The integrated circuit test equipment (1A) according to claim 9, wherein the lower base (21) further comprises a corner stick (212) extending from each corner of the rectangular plate (211), the elastic arm (24) comprises a T-shaped movable block (241) and an elastic needle (245), the elastic needle (245) is elastically clamped between the T-shaped movable block (241) and the corner stick (212).

11. The integrated circuit test equipment (1A) according to claim 10, wherein the bottom of the T-shaped movable block (241) forms a V-shaped groove (242) while the top of the T-shaped movable block (241) forms a plugging hole (243) for the elastic needle (245) to be plugged in.

12. The integrated circuit test equipment (1A) according to claim 10, wherein a pair of protruding sticks (32) extends from the corresponding corner of the opening (31) of the cover plate (30), the pair of protruding sticks (32) is disposed in a manner corresponding to the two lateral sides of T-shaped movable block (241), the movable structure (A) comprises a first inclined plane (244) formed on the T-shaped movable block (241) and a second inclined plane (321) formed on the protruding stick (32), the inclined directions of the second inclined plane (321) and the first inclined plane (244) are opposite and are in sliding contact.

13. The integrated circuit test equipment (1A) according to claim 9, wherein a guide groove (232) connecting the chip socket (231) is formed on the upper base (23), and the T-shaped movable block (241) is installed in the guide groove (232) and is capable of being operated to move.

14. The integrated circuit test equipment (1A) according to claim 9, wherein the rectangular plate (211) of the lower base (21) is disposed with a plurality of guide holes (214), and the upper base (23) is connected to a plurality of positioning sticks (233) going through each guide hole (214).

* * * * *